(12) United States Patent
Horikoshi

(10) Patent No.: US 10,126,645 B2
(45) Date of Patent: Nov. 13, 2018

(54) ADHESIVE SUITABLE FOR A PELLICLE FOR EUV LITHOGRAPHY AND A PELLICLE USING THE SAME ADHESIVE

(71) Applicant: SHIN-ETSU CHEMICAL CO., LTD., Tokyo (JP)

(72) Inventor: Jun Horikoshi, Gunma-Ken (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 105 days.

(21) Appl. No.: 15/337,747

(22) Filed: Oct. 28, 2016

(65) Prior Publication Data
US 2017/0123308 A1    May 4, 2017

(30) Foreign Application Priority Data

Oct. 29, 2015 (JP) .................. 2015-212619
Dec. 16, 2015 (JP) .................. 2015-245060

(51) Int. Cl.
| | | |
|---|---|---|
| G03F 1/62 | (2012.01) | |
| G03F 1/64 | (2012.01) | |
| C09J 183/00 | (2006.01) | |
| C09J 163/00 | (2006.01) | |

(52) U.S. Cl.
CPC .............. G03F 1/64 (2013.01); C09J 163/00 (2013.01); C09J 183/00 (2013.01)

(58) Field of Classification Search
None
See application file for complete search history.

(56) References Cited

U.S. PATENT DOCUMENTS

| | | | |
|---|---|---|---|
| 6,492,067 B1 * | 12/2002 | Klebanoff | ................ G03F 1/64 428/14 |
| 9,341,943 B2 | 5/2016 | Horikoshi | |
| 2015/0286133 A1 | 10/2015 | Horikoshi | |

FOREIGN PATENT DOCUMENTS

| | | | |
|---|---|---|---|
| EP | 2 927 746 A2 | | 10/2015 |
| JP | 11-024237 | * | 1/1999 |
| JP | 1124237 A | | 1/1999 |
| JP | 2008299185 A | | 12/2008 |
| WO | 2014/142125 A1 | | 9/2014 |

OTHER PUBLICATIONS

European Search Report corresponding to EP 16 19 4501—dated Jul. 4, 2017—Date of Completion: Mar. 27, 2017.
English Translation of JP 1124237 A—Publication Date: Jan. 29, 1999.
English Translation of JP 2008299185—Publication Date: Dec. 11, 2008.
English Translation of WO 2014142125—Publication Date: Sep. 18, 2014.

* cited by examiner

*Primary Examiner* — Marc S Zimmer
(74) *Attorney, Agent, or Firm* — Millen White Zelano & Branigan, PC

(57) ABSTRACT

A pellicle is proposed in which an adhesive layer is formed of an adhesive which undergoes a hardness change at a rate from −50% through +50% of its initial hardness, measured after curing, when it is let to sit in atmosphere of a temperature of 300 degrees C. for 7 days on end; the rate of hardness change being defined by a following equation:

Rate of hardness change (%)={(hardness after the sitting)−(initial hardness before the sitting)}÷initial hardness before the sitting×100.

5 Claims, 1 Drawing Sheet

ADHESIVE SUITABLE FOR A PELLICLE FOR EUV LITHOGRAPHY AND A PELLICLE USING THE SAME ADHESIVE

The present non-provisional application claims priority under 35 U.S.C. § 119(a) from Japanese Patent Applications No. 2015-212619 filed on Oct. 29, 2015 and 2015-245060 filed on Dec. 16, 2015, the entire disclosure of which is hereby incorporated herein by reference.

FIELD OF THE INVENTION

The present invention relates to an adhesive suitable for a pellicle for EUV lithography and a pellicle using the same adhesive, and more particularly it relates to an adhesive suitable for a pellicle that is used in a lithography operation wherein the light used is EUV (Extreme Ultra-Violet) ray whose main wavelength is 13.5 nm, for example, and a pellicle using the same adhesive.

TECHNICAL BACKGROUND OF THE INVENTION

In manufacturing semiconductor devices such as LSI and super-LSI or in manufacturing a liquid crystal display board or the like, a pattern is made by irradiating a light to a semiconductor wafer or an original plate for liquid crystal, but if a dust particle is attached to a photo mask or a reticle (hereinafter collectively referred to as "photo mask" for simplicity) which is used during the irradiation operation, the dust particle would block off or reflect the light so that the resulting pattern would have roughened edges or black stains on the base, which would lead to problems such as damaged dimensions, poor quality, and deformed external appearance.

Thus, these works are usually performed in a cleanroom, but it is still not easy to keep the photo mask clean all the time; therefore, a pellicle is attached to a surface of the photo mask as a dust-fender before light exposure is carried out. Under such circumstances, dust particles do not directly adhere to the surface of the photo mask but adhere only to the pellicle film, and since this film is sufficiently remote from the photo mask surface if the photo focus is set on a lithography pattern on the photo mask, the foreign particles on the pellicle film fail to transfer their shadows on the photo mask and thus no longer become a cause for problems to the image transfer performance.

In general, a pellicle is made by adhering a transparent pellicle film, which is made of a highly light transmitting material such as cellulose nitrate, cellulose acetate, fluorine-containing polymer and the like, to an upper annular end face of a pellicle frame made of aluminum, stainless steel, polyethylene or the like, using as the glue either a solvent capable of dissolving the pellicle film, which is applied to said upper annular end face (hereinafter this face is called "upper end face") and then air-dried before receiving the film (ref. IP Publication 1), or an adhesive such as acrylic resin, epoxy resin or the like (ref. IP Publication 2). Further the other annular end face (hereinafter called "lower end face") of the pellicle frame is covered with an agglutinant layer made of polybutene resin, polyvinyl acetate resin, acrylic resin, silicone resin or the like for attaching the pellicle frame to the photo mask, and over this agglutinant layer is laid a release liner (separator) to protect the agglutinant layer.

Now, in recent years, the semiconductor devices and the liquid display board have undergone further improvement in integration and densification. Currently, a technology of forming a fine pattern having a resolution level of 32 nm on a photo resist film is on the verge of realization. Such patterning can be effectively achieved by improved technologies such as the immersion exposure method, wherein the space between the semiconductor wafer or the original plate for liquid crystal on one hand and the projection lenses on the other is filled with a liquid such as super pure water and the photo resist film is exposed to an argon fluoride (ArF) eximer laser, or the double exposure method, which uses a conventional argon fluoride (ArF) eximer lasar, to which the photo resist film is exposed.

However, the next-generation semiconductor devices and the liquid display board are called on to have even denser patterning of a level of 10 nm or smaller, and there is scarce room for the conventional exposure technology depending on excimer laser to improve to answer such high demand of making a dense pattern of the level of 10 nm or smaller.

Now, as a most promising method for forming a pattern of a density of 10 nm or smaller, an EUV exposure technology which uses an EUV light of a dominant wavelength of 13.5 mm is in the spotlight. In order to achieve a pattern formation on the density level of as high as 10 nm or smaller on the photo resist film, it is necessary to solve the technical problems with regard to the choices of light source, photo mask, pellicle, etc., and in respect of light source and photo mask there have been considerable progress and various porposals have been made.

With respect to the pellicle that could improve yields of semiconductor device products or liquid crystal displays, IP Publication 3, for example, discloses a silicon film of a thickness of 0.1-2.0 micrometers to act as the pellcile film for EUV lithography which is transparent and does not give rise to optical distortion; however there remain unsolved problems in this film, which have prevented realization of the EUV light exposure technology.

PRIOR ART PUBLICATIONS

Publications

[IP Publication 1]
Japanese Patent Application Publication S58[1983]-219023
[IP Publication 2]
Japanese Pre-Patent Publication for Public Review S63 [1988]-27707
[IP Publication 3]
U.S. Pat. No. 6,623,893

SUMMARY OF THE INVENTION

Problems the Invention Seeks to Solve

In respect of materials to make the adhesive for bonding the pellicle film to the pellicle frame, the selection has been made solely based on the adhesive strength of them in the case of the conventional lithography where the exposure lights used were i-line (wavelength of 365 nm), krypton fluoride (KrF) excimer laser (wavelength of 248 nm), or argon fluoride (ArF) excimer laser (wavelength of 193 nm).

However, according to an experiment which was conducted in a circumstance simulated to an EUV exposure light lithography, where a pattern of a fineness order of 10 nm or smaller was printed on the photo resist film, it was found that a problem occurs often, which is that the pellicle film glued with conventionally used adhesives peels from the pellicle frame.

Hence, the present inventor repeated the simulation upon a personal computer in order to solve this problem, and as a result, he came to find that it is possible that the portion of the pellicle film of silicon which is irradiated with the EUV light is heated to a temperature of about 500 degrees C. by the energy of the EUV light, and from this he calculated to find that the adhesive (layer) which glues the pellicle film to the pellicle frame would experience a heat of 200 to 300 degrees C. Accordingly, he concluded that the primary cause for the peeling off of the pellicle film in the above-mentioned experiment was this heat. In other words, the adhesive would undergo a hardness change at high temperatures, and if the change is toward higher hardness the adhesive layer would become brittle so that it fails to keep the pellicle film from peeling off, and on the other hand if the change is toward lower hardness, the adhesive layer would become fluid-like so that it fails to fix the pellicle film on the pellicle frame and allows it to peel off. Thus the inventor theorized that in the case of a pellicle for the EUV lithography, if the adhesive has a relatively low stability against heat, it hardens or softens excessively whereby it loses much of its adhesive strength.

Hence the present invention was contrived in view of the above circumstances, and an object of the invention is to provide an adhesive which is suitable for a pellicle for EUV lithography in that it has a high heat resistance (heat stability) at high temperatures that is commonly experienced in EUV light exposure lithography, and also it is an object of the invention to provide a pellicle in which such an adhesive is used to form the adhesive layer; furthermore the invention provides a method for manufacturing such a pellicle and a method for selecting such an adhesive suitable for the pellicle for EUV lithography.

Means to Solve the Problems

In order to attain the objects, the inventor researched hard and came to a discovery that out of many kinds of adhesives an adhesive which undergoes hardness change at a rate from −50% through +50% of the original hardness, measured after curing, when it is let to sit in the atmosphere of a temperature of 300 degrees C. for 7 days on end, makes a suitable adhesive for use in EUV light exposure lithography, and hence the inventor possessed the invention.

Therefore, the adhesive of the present invention is an adhesive suitable for a pellicle for EUV lithography, and it has a rate of hardness change within the range from −50% through +50% when, after being cured, it is let to sit in an atmosphere of a temperature of 300 degrees C. for 7 days on end; the rate of hardness change being calculated in accordance with the following equation.

Rate of hardness change (%)={(hardness after the sitting)−(hardness before the sitting)}÷(hardness before the sitting)×100.  Equation:

Also, the pellicle for EUV of the present invention comprises a pellicle film, a pellicle frame, and an adhesive layer laid on one end face of the pellicle frame, to which the pellicle film is adhered via the adhesive layer, wherein the adhesive layer is formed of the adhesive of the present invention as specified above.

Also, the method for making a pellicle according to the present invention is a method for making the pellicle for EUV lithography comprising a pellicle film, a pellicle frame, and an adhesive layer laid on one end face of the pellicle frame, to which the pellicle film is adhered via the adhesive layer, wherein the method includes a step whereat the adhesive of the present invention as specified above is applied to the pellicle frame.

Also, the method for selecting an adhesive of the present invention consists of selecting an adhesive suitable for the pellicle for EUV lithography and is characteristic in that an adhesive is selected if the adhesive undergoes a hardness change at a rate from −50% through +50% of its initial hardness, measured after curing, when it is let to sit in atmosphere of a temperature of 300 degrees C. for 7 days on end; the rate of hardness change being defined by a following equation:

Rate of hardness change (%)={(hardness after the sitting)−(hardness before the sitting)}÷(hardness before the sitting)×100.

Effects of the Invention

The adhesive of the present invention has a heat stability at a temperature which is typically experienced in EUV exposure light lithography, so that it is possible for the adhesive to maintain sufficient adhesive strength to bind the pellicle film and the pellicle frame together. Thus, by using a pellicle wherein the pellicle film is adhered to the pellicle frame with the adhesive of the present invention, it becomes possible to form a high density patterning of a level of 10 nm or smaller on the photo resist film, using the EUV light.

A longitudinal cross section of a pellicle wherein the adhesive of the present invention is used.

FIG. 2

A schematic perspective view of an adhesive application apparatus which can be employed for the purpose of making the pellicle of the present invention.

EXAMPLES TO EMBODY THE INVENTION

We will now explain in detail with reference to the drawings how the present invention can be embodied, but the invention is not limited to such embodiments.

Figure 1:
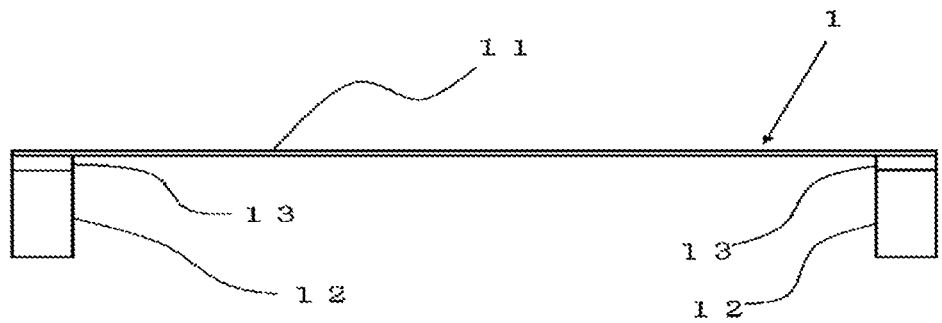
FIG. 1

FIG. 1 is a longitudinal cross section of an embodiment of a pellicle 1 wherein an adhesive layer 13 is formed of the adhesive of the present invention. This pellicle 1 is a pellicle for EUV lithography, which includes a pellicle film 11, a pellicle frame 12, and the adhesive layer 13, which binds these together. In this pellicle 1—which ordinarily has a quadrilateral shape (rectangular or square) to meet the shape of the base plate (photo mask or its glass substrate part), not shown, to which the pellicle 1 is to be affixed—the pellicle film 11 is tensely adhered to the upper end face of the quadrilateral pellicle frame 12 by means of the adhesive layer 13.

Now, there is no particular limitation as to the material of the pellicle film 11 nor as to that of the pellicle frame 12, and any conventionally used materials may be used.

It is preferable, however, that the pellicle film 11 is made of single crystal silicon, polycrystalline silicon, amorphous silicon or the like which has a high transmission coefficient with respect to EUV light. It is also possible to provide a protective film made of SiC, $SiO_2$, $Si_3N_4$, SiON, $Y_2O_3$, YN, Mo, Ru, Rh, etc. for the purpose of supporting the pellicle film 11.

As for the material for the pellicle frame 12, glass and metals, which have relatively low linear expansion coefficients, are preferable, and for the reason of higher heat radiation, workability, and strength, metals are more preferred.

The adhesive layer 13 of the present invention is laid on the upper end face of the pellicle frame 12 endlessly, and is for bonding the pellicle film 11 onto the pellicle frame 12. The present invention requires that the adhesive layer 13 be made of a material that exhibits a rate of hardness change within the range from −50% through +50% when, after being cured, it is let to sit in an atmosphere at 300 degrees C. for 7 days on end, the rate of hardness change being calculated in accordance with the following equation:

Rate of hardness change (%)={(hardness after the sitting)−(hardness before the sitting)}÷(hardness before the sitting)×100.

Such adhesive has high resistance and high stability against heat that is experienced in EUV lithography, so that it is especially suitable for use in pellicles for EUV lithography. Incidentally, in this specification as well as in the claims the "hardness" of the adhesive or the like, after being cured, is defined as the value of hardness which is obtained in the hardness test conducted pursuant to JIS K 6249; 2003, and especially in the case wherein an apparatus of durometer type A is employed.

In order to obtain the adhesive 13 of the present invention, one can procure adhesive materials from the market and, after curing them, let them sit in an atmosphere of 300 degrees C. for 7 days on end and then examine whether the above-defined rate of hardness change falls in the range from −50% through +50%, and only the ones that did fall in the range are set aside for use. In this way, it is possible to obtain adhesives that are suitable for a pellicle for EUV lithography, without going through complicated manufacturing of such adhesives.

Examples of adhesive 13 that satisfy the above-stated requirement include silicone-based adhesives such as KE-1803 and KE-1854 (both are product names of the silicone-based adhesives manufactured by Shin-Etsu Chemical Co., Ltd.) and epoxy-based adhesive such as EK2000 (product name of epoxy-based adhesive manufactured by Epoxy Technology, Inc.). These are highly heat-resistant to temperatures as high as 300 degrees C., and thus can be dependably used. According to the prescription, KE-1803 is of three-component room temperature curing type; however the time required for curing can be shortened by applying heat to the adhesive. KE-1854 is of one-component heat curing type, and EK2000 is of two-component heat curing type.

There is no limit as to the manner in which the adhesive 13 of the present invention is cured, and it can be of one-component room temperature curing type, one-component heat curing type, two-component room temperature curing type, two-component heat curing type, three-component room temperature curing type, or ultraviolet ray curing type, etc.

The adhesive 13 of the present invention is suitable for adhering the pellicle film to the pellicle frame, and it is especially suitable when used in a pellicle for EUV lithography. As described above, a part of the pellicle film can be exposed to a high temperature of 500 degrees C. created by the energy of the exposure light, and the adhesive layer bonding the pellicle film and the pellicle frame together can experience a temperature of 200 through 300 degrees C. Therefore, the adhesive 13 of the present invention needs to have a sufficient heat resistance at such high temperatures; and in a heat-resistance test conducted on the adhesive 13 of the present invention (wherein the pellicle 1 was let to sit in an oven of an atmosphere of 250 degrees C. for 7 days, and was cooled to room temperature), it was found that in cases where the adhesive 13 was a kind that satisfies the above-mentioned requirement of the present invention, the pellicle film 11, although exposed to the temperature of 250 degrees C., was confirmed to have kept its tensed appearance (ref. Examples hereinafter described). This result indicates that the adhesive 13 of the present invention retains sufficient adhesive strength despite its exposure to the high temperature of 250 degrees C., so that it is deemed that there is a possibility that the adhesive 13 of the present invention can resist temperatures as high as 300 degrees C. or so, to say nothing of 200 degrees C.

Figure 2:
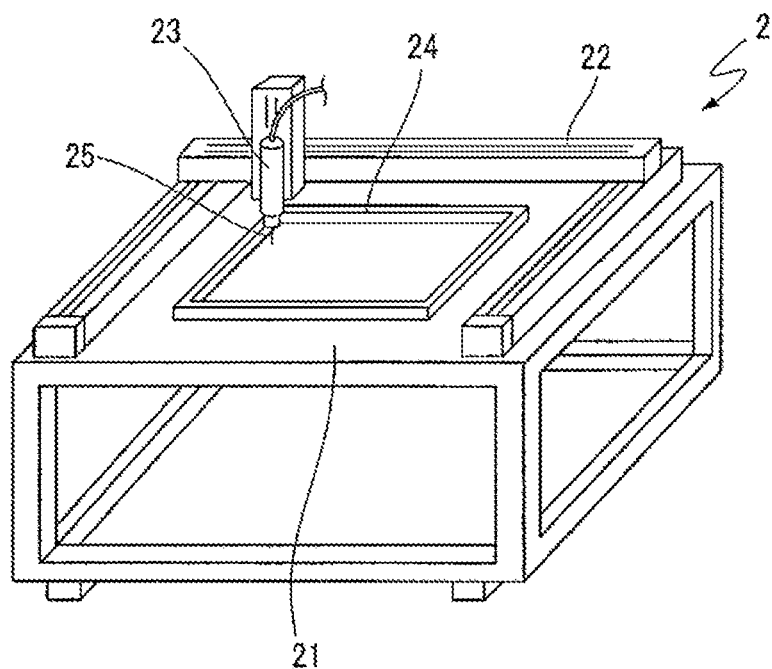

To apply the adhesive having a high heat resistance, such as adhesive 13, to the pellicle frame 12, it is possible to adopt an adhesive dispenser machine like the one shown in FIG. 2, for example. FIG. 2 is a schematic drawing showing an example of such an adhesive dispenser machine, which can be suitably used to apply the adhesive 13. In this adhesive dispenser machine 2, a syringe 23 is held above a pedestal table 21 via a triaxial robot 22, which is constituted by a combination of a stationary rail and a movable rail, in a manner such that the syringe 23 is able to move in directions of x, y and z axes. This syringe 23 has a needle 25 at its forefront; and the syringe 23 filled with the adhesive 13 is connected to an air pressure type dispense means (not shown) and both the robot operation and the liquid discharge operation are controlled by a control means (not shown) built in the triaxial robot 22.

Then, the pellicle frame 24 is set on the pedestal table 21 of the adhesive dispenser machine 2, and the adhesive 13 is dropped from the needle 25 while the syringe is shifted tracing the pellicle frame 24, whereby the adhesive can be laid endlessly on the pellicle frame 24. As for a transport means (not shown) for the adhesive 13, it is possible to select from various types which have a function of controlling the supply rate and the timings of discharge and non-discharge, such as a syringe pump, a plunger pump, a tube pump as well as a pneumatic type system using air pressure, nitrogen gas pressure or the like.

Further, if it is difficult to dispense the adhesive 13 with the dispenser machine 2 because of high viscosity thereof, it is possible, depending on the degree of necessity, to dilute the adhesive with a solvent, for example an aromatic solvent such as toluene and xylene, or an aliphatic solvent such as hexane, octane, isooctane, and isoparaffin, or a ketone solvent such as methyl ethyl ketone and methyl isobutyl ketone, or an ester solvent such as ethyl acetate and butyl acetate, or an ether solvent such as diisopropyl ether and 1,4-dioxane, or a mixture of any of these.

EXAMPLES

Now, the present invention will be explained in detail with reference to examples and comparative examples.

Example 1

Firstly, a rectangular pellicle frame made of Super Inver (super invariable steel, which is an alloy of iron, nickel, and cobalt) measuring externally 151 mm×118 mm×1.5 mm (height) and 4 mm (width) was cut out, and was brought in a cleanroom; and after being thoroughly washed with a neutral detergent and pure water, it was dried completely.

Next, the thus prepared pellicle frame 24 was fixed on the pedestal table 21 of the adhesive dispenser machine 2, shown in FIG. 2.

As the adhesive 13 having high heat resistance, the silicone-based adhesive KE-1803 (a product of Shin-Etsu Chemical Co., Ltd.) was adopted. This KE-1803 is of three-component room temperature curing type; hence, in accordance with the prescription, the main component, the curing agent component and the catalyst component of KE-1803 were combined together at a mass ratio of 100:10:10, and were stirred thoroughly to produce the adhesive 13.

Then, the syringe 23 made of polypropylene (PP) of the adhesive dispenser machine 2, shown in FIG. 2, was filled with the thus prepared adhesive 13; next, the syringe 23 was connected to an air pressure type dispenser, not shown, (manufactured by Iwashita Engineering Co., Ltd.). In the adhesive dispenser machine 2, both the robot operation and the application liquid discharge operation were controlled by the control means (not shown) built in the triaxial robot 22 in accordance with a program; thus, through an automatic operation, the adhesive 13 was dropped from the needle 25 onto the upper end face of the pellicle frame 24 in a manner such that the entire circuit of the upper end face of the frame 24 was endlessly laid with an adhesive layer 13.

Next, a pellicle film 11 was adhered to the upper end face of the pellicle frame 24, and excessive part of the pellicle film extending beyond the pellicle frame was trimmed off with a knife cutter. The adhesive 13 was cured by letting it sit at a room temperature of 25 degrees C. for 24 hours, whereby a pellicle 1 was completed.

Example 2

A pellicle 1 was made in the same manner as in Example 1 except that, as the adhesive 13, the silicone-based adhesive KE-1854 (a product of Shin-Etsu Chemical Co., Ltd.), which is of one-component heat curing type, was adopted, and was cured according to its prescription.

Example 3

A pellicle 1 was made in the same manner as in Example 1 except that, as the adhesive 13, the silicone-based adhesive KE-1880 (a product of Shin-Etsu Chemical Co., Ltd.), which is of one-component heat curing type, was adopted, and was cured according to its prescription.

Example 4

A pellicle 1 was made in the same manner as in Example 1 except that, as the adhesive 13, the epoxy-based adhesive EK2000 (a product manufactured by Epoxy Technology, Inc.), which is of two-component heat curing type, was adopted, and was cured according to its prescription.

Comparative Example 1

A pellicle 1 was made in the same manner as in Example 1 except that, as the adhesive 13, an epoxy-based heat resistant adhesive Araldite AV138M-1 (a product of Ciba-Geigy Japan Limited) was adopted, and was cured according to its prescription.

Comparative Example 2

A pellicle 1 was made in the same manner as in Example 1 except that, as the adhesive 13, an acrylic adhesive Metal Lock (a product of CEMEDINE Co., Ltd.) was adopted, and was cured according to its prescription.

Comparative Example 3

A pellicle 1 was made in the same manner as in Example 1 except that, as the adhesive 13, a silicone-based adhesive KE-3490 (a product of Shin-Etsu Chemical Co., Ltd.) was adopted, and was cured according to its prescription.

Comparative Example 4

A pellicle 1 was made in the same manner as in Example 1 except that, as the adhesive 13, an epoxy-based heat resistant adhesive Araldite 2000 (a product of Ciba-Geigy Japan Limited) was adopted, and was cured according to its prescription.

[Heat-Resistance Test on Adhesives]

The adhesives used in Examples 1-4 and Comparative Examples 1-4 were cured according to their respective prescriptions and the thus cured adhesives were let to sit in an oven at the temperature of 300 degrees C. for 7 days on end, and thereafter they were cooled to room temperature and they were evaluated in terms of heart resistance. The heat resistance evaluation was based on their rate of change in hardness which is defined in the following equation. The result is shown in Table 1.

Rate of hardness change (%)={(hardness after the sitting)−(hardness before the sitting)}÷hardness before the sitting)×100     Equation:

[Heat-Resistance Test on Pellicles]

The pellicles made in Examples 1-4 and Comparative Examples 1-4 were let to sit in an oven at the temperature of 250 degrees C. for 7 days on end, and thereafter they were cooled to room temperature, and they were evaluated in terms of the tenseness of the pellicle film 11. The result was as shown in Table 1.

TABLE 1

|  | Heat-resistance Test on Adhesives (300 deg. C.) | | Heat-resistance Test on Pellicles (250 deg. C.) | |
| --- | --- | --- | --- | --- |
|  | Rate of hardness change (%) | Appearance after the test | Tenseness of pellicle film after the test | Overall Evaluation |
| Example 1 | +40 | not brittle | good | Success |
| Example 2 | +50 | not brittle | good | Success |
| Example 3 | −30 | not brittle | good | Success |
| Example 4 | +50 | not brittle | good | Success |
| Comparative Example 1 | +350 | brittle | pellicle film detached partially | Failure |
| Comparative Example 2 | +400 | brittle | pellicle film detached partially | Failure |
| Comparative Example 3 | +200 | brittle | pellicle film detached partially | Failure |
| Comparative Example 4 | −100 | softened | pellicle film detached partially | Failure |

As is seen in Table 1, in the cases of the adhesives of Examples 1 through 4, their respective hardness change rates over the 300 degrees C. heat-resistance test were +40%, +50%, −30%, and +50% and these are within the range specified by the present invention, and also in those Examples the pellicle films adhered to the pellicle frames with those respective adhesives kept tensed and did not detach from the frames throughout the 250 degrees C. heat-resistance test. Thus the adhesives used in Examples 1 through 4 were confirmed to undergo less degradation in adhesive strength at high temperatures and to have high heat resistance.

On the other hand, in the case of the adhesives used in Comparative Examples 1 through 3, their respective hardness change rates over the 300 degrees C. heat-resistance test were as high as +350%, +400%, and +200%; and they turned to be brittle. Also, the adhesive of Comparative Example 4 exhibited a hardness change rate of −100% over the 300 degrees C. heat-resistance test; and it turned softer. It was also observed that all the pellicle films of Comparative Examples 1 through 4 partially detached from the pellicle frames during the heat-resistance test on pellicles, so that those adhesives used in the comparative examples were found poor in heat-resistance.

Therefore, the silicone-based adhesives KE-1803, KE-1854, KE-1880, and the epoxy-based adhesive EK2000, which were used in Examples 1 through 4, were estimated to be excellent in heat resistance, so that overall they were confirmed to make suitable adhesives for a pellicle used in EUV light exposure lithography.

EXPLANATION OF REFERENCE NUMERALS

1: pellicle
2: adhesive dispenser machine
11: pellicle film
12: pellicle frame
13: adhesive layer
21: pedestal table
22: triaxial robot
23: syringe
24: pellicle frame
25: needle

The invention claimed is:

1. A pellicle for EUV lithography comprising a pellicle film, a pellicle frame, and an adhesive layer laid on one end face of the pellicle frame, to which the pellicle film is adhered via the adhesive layer, wherein the adhesive layer is formed of an adhesive which undergoes a hardness change at a rate in a range of from −50% through +50% of its initial hardness, measured after curing, when it is let to sit in atmosphere of a temperature of 300 degrees C. for 7 days on end; the rate of hardness change being defined by a following equation:

Rate of hardness change (%)={(hardness after said sitting)−(initial hardness before said sitting)}÷(initial hardness before said sitting)×100.

2. A pellicle for EUV lithography as claimed in claim 1, wherein said adhesive layer is suitable for exposure to a temperature of 200 through 300 degrees C. during EUV light exposure and for maintaining its tensed appearance and sufficient adhesive strength to bind the pellicle film and the pellicle frame together.

3. A pellicle for EUV lithography as claimed in claim 1, wherein said adhesive is a silicone-based adhesive.

4. A pellicle for EUV lithography as claimed in claim 1, wherein said adhesive is an epoxy-based adhesive.

5. A method for manufacturing a pellicle for EUV lithography, said pellicle comprising a pellicle film, a pellicle frame, and an adhesive layer laid on one end face of said pellicle frame, to which the pellicle film is adhered via the adhesive layer, wherein said method comprises a step of applying to said one end face of the pellicle frame an adhesive which undergoes a hardness change at a rate in a range of from −50% through +50% of its initial hardness, measured after curing, when it is let to sit in atmosphere of a temperature of 300 degrees C. for 7 days on end; the rate of hardness change being defined by a following equation:

Rate of hardness change (%)={(hardness after said sitting)−(initial hardness before said sitting)}÷(initial hardness before said sitting)×100.

* * * * *